(12) United States Patent
Son

(10) Patent No.: US 12,356,778 B2
(45) Date of Patent: Jul. 8, 2025

(54) DISPLAY DEVICE AND METHOD FOR MANUFACTURING DISPLAY DEVICE

(71) Applicant: LG Display Co., Ltd., Seoul (KR)

(72) Inventor: Hyeon Ho Son, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 475 days.

(21) Appl. No.: 17/777,597

(22) PCT Filed: Mar. 10, 2020

(86) PCT No.: PCT/KR2020/003324
§ 371 (c)(1),
(2) Date: May 17, 2022

(87) PCT Pub. No.: WO2021/107278
PCT Pub. Date: Jun. 3, 2021

(65) Prior Publication Data
US 2023/0018566 A1      Jan. 19, 2023

(30) Foreign Application Priority Data

Nov. 28, 2019   (KR) .................. 10-2019-0155155

(51) Int. Cl.
*H10H 20/856*        (2025.01)
*H01L 25/16*         (2023.01)
(Continued)

(52) U.S. Cl.
CPC ......... *H10H 20/856* (2025.01); *H01L 25/167* (2013.01); *H10H 20/833* (2025.01); *H10H 20/032* (2025.01); *H10H 20/0363* (2025.01)

(58) Field of Classification Search
CPC ......... H01L 33/60; H01L 33/38; H01L 33/42; H01L 25/167; H10H 20/856; H10H 20/0363; H10H 20/831
See application file for complete search history.

(56) References Cited

U.S. PATENT DOCUMENTS

2014/0367633 A1   12/2014   Bibl et al.
2017/0358624 A1   12/2017   Takeya et al.
(Continued)

FOREIGN PATENT DOCUMENTS

KR   10-2011-0010990 A   2/2011
KR   10-2016-0010869 A   1/2016
(Continued)

OTHER PUBLICATIONS

Extended European Search Report issued on Nov. 27, 2023, in connection with EP Application No. 20892784.8.
(Continued)

*Primary Examiner* — Walter H Swanson
*Assistant Examiner* — Jacob T Nelson
(74) *Attorney, Agent, or Firm* — Morgan, Lewis & Bockius LLP

(57) ABSTRACT

A display device and a manufacturing method of a display device are provided. The display device includes a substrate including a pixel defined thereon; a light emitting diode disposed in the pixel; an insulating layer covering the light emitting diode; a light collecting structure on at least a part of the insulating layer; and a reflective layer disposed at a side surface of the light collecting structure. The side surface of the light collecting structure may have a reverse tapered shape.

23 Claims, 17 Drawing Sheets

(51) Int. Cl.
    *H10H 20/833*     (2025.01)
    *H10H 20/01*     (2025.01)

(56) References Cited

U.S. PATENT DOCUMENTS

| | | |
|---|---|---|
| 2018/0090058 A1 | 3/2018 | Chen et al. |
| 2021/0184088 A1 | 6/2021 | Kwon et al. |

FOREIGN PATENT DOCUMENTS

| | | | |
|---|---|---|---|
| KR | 10-2017-0026959 A | 3/2017 | |
| KR | 10-2019-0068112 A | 6/2019 | |
| WO | WO-2019147589 A1 * | 8/2019 | ............. H01L 24/08 |

OTHER PUBLICATIONS

International Search Report (with partial translation) and Written Opinion dated Aug. 27, 2020, for corresponding International Patent Application No. PCT/KR2020/003324.

* cited by examiner

| CLASSIFICATION | GRADIENT | TOTAL LIGHT QUANTITY (lumen) | TOTAL LIGHT QUANTITY RATIO (%) | FRONT LUMINANCE (nit) | FRONT LUMINANCE RATIO (%) |
|---|---|---|---|---|---|
| A | X | 24.628 | 81.0% | 63.5 | 98.9% |
| B | 10DEGREES | 30.870 | 101.5% | 87.9 | 133.1% |
| C | 20DEGREES | 34.571 | 113.7% | 103.9 | 157.3% |
| D | 30DEGREES | 35.351 | 116.2% | 128.1 | 194.0% |
| E | 40DEGREES | 34.527 | 113.5% | 97.8 | 148.1% |
| F | 50DEGREES | 33.242 | 109.3% | 110.2 | 166.9% |
| G | 60DEGREES | 32.621 | 107.2% | 112.2 | 169.9% |

FIG. 7

DISPLAY DEVICE AND METHOD FOR MANUFACTURING DISPLAY DEVICE

TECHNICAL FIELD

The present disclosure relates to a display device and a method of manufacturing the same, and more particularly to, a display device using a light emitting diode (LED) and a method of manufacturing the same.

BACKGROUND ART

Currently, as the information era enters its full-scale phase, a field of display devices which visually expresses electrical information signals has been rapidly developed and studies are continued to improve performances of various display devices such as a thin-thickness, a light weight, and low power consumption.

Among various display devices, a light emitting display device is a self-emitting display device so that a separate light source is not necessary, which is different from a liquid crystal display device. Therefore, the light emitting display device may be manufactured to have a light weight and a small thickness. Further, since the light emitting display device is driven at a low voltage so that it is advantageous not only in terms of power consumption, but also in terms of color implementation, a response speed, a viewing angle, a contrast ratio (CR). Therefore, it is expected to be utilized in various fields.

DISCLOSURE

Technical Problem

As a light emitting display device, a light emitting display device which is manufactured by transferring an ultra-small light emitting diode (LED) onto a thin film transistor array substrate is being used. Further, the LED is a light emitting element attracting attention because it has a fast lighting speed, low power consumption, and excellent stability due to high impact resistance and displays an image having high luminance. However, it has a limitation in implementing an image with a high luminance due to light leaked to the periphery of the LED.

For example, light emitted from the LED is guided through an organic layer or a substrate disposed in the vicinity of the LED to be lost to the outside of the display device. Even though the LED itself is a device which emits light with a high luminance, the luminous efficiency is deteriorated due to the periphery so that a higher current is required, which increases the power consumption. In the case of the outdoor product group which mainly implements images with a high luminance, the heat generation is more serious, which shortens the lifespan of the LED.

Therefore, the inventors of the present disclosure invented a light emitting display device with a new structure to solve the problems of the deteriorated luminous efficiency and the shortened lifespan of the LED display device. Specifically, a display device which forms a structure which reflects the LED light in the periphery of the LED to improve the luminous efficiency and a display device manufacturing method have been invented.

An object to be achieved by the present disclosure is to provide a display device which improves a luminous efficiency without increasing a current which is applied to the LED.

Another object to be achieved by the present disclosure is to provide a display device which improves the lifespan while implementing a high luminance.

Further, still another object to be achieved by the present disclosure is to provide a display device which collects light emitted or reflected toward a side surface of the LED to an upper portion of the LED.

Objects of the present disclosure are not limited to the above-mentioned objects, and other objects, which are not mentioned above, can be clearly understood by those skilled in the art from the following descriptions.

Technical Solution

In order to solve the problems as described above, a display device according to an aspect of the present disclosure comprises a substrate including a pixel, a light emitting diode disposed in the pixel, an insulating layer covering the light emitting diode, a light collecting structure enclosing at least a part of the insulating layer and a reflective layer disposed on a side surface of the light collecting structure, wherein the side surface of the light collecting structure has a reverse tapered shape.

Also, a manufacturing method of a display device according to an aspect of the present disclosure comprises disposing a light emitting diode on a substrate on which a pixel circuit is formed, forming a first insulating layer on the light emitting diode, forming a second insulating layer on the light emitting diode and the first insulating layer, forming a metal material layer on the second insulation layer and forming a reflective layer by etching at least a part of the metal material layer, wherein the reflective layer is formed on a side surface of the second insulating layer and the reflective layer forms an acute angle with a normal line of the substrate.

Other detailed matters of the exemplary embodiments are included in the detailed description and the drawings.

Advantageous Effects

According to the present disclosure, a light collecting structure is disposed in the periphery of the light emitting diode to minimize light leaked to the periphery of the light emitting diode.

Further, according to the present disclosure, the light collecting structure is formed to have a reverse tapered shape to improve the light collecting efficiency.

Further, the present disclosure may provide an optimal structure which improves the luminous efficiency even though a type of the light emitting diode is changed or a design of the periphery of the light emitting diode is changed.

Further, according to the present disclosure, a light collecting structure and a side reflective layer are formed to have the same height to improve the luminous efficiency of the display device.

The effects according to the present disclosure are not limited to the contents exemplified above, and more various effects are included in the present specification.

DESCRIPTION OF DRAWINGS

FIG. 7 is a table showing an experiment result of various exemplary embodiments and a comparative embodiment of the present disclosure.

MODES OF THE DISCLOSURE

Figure 1:
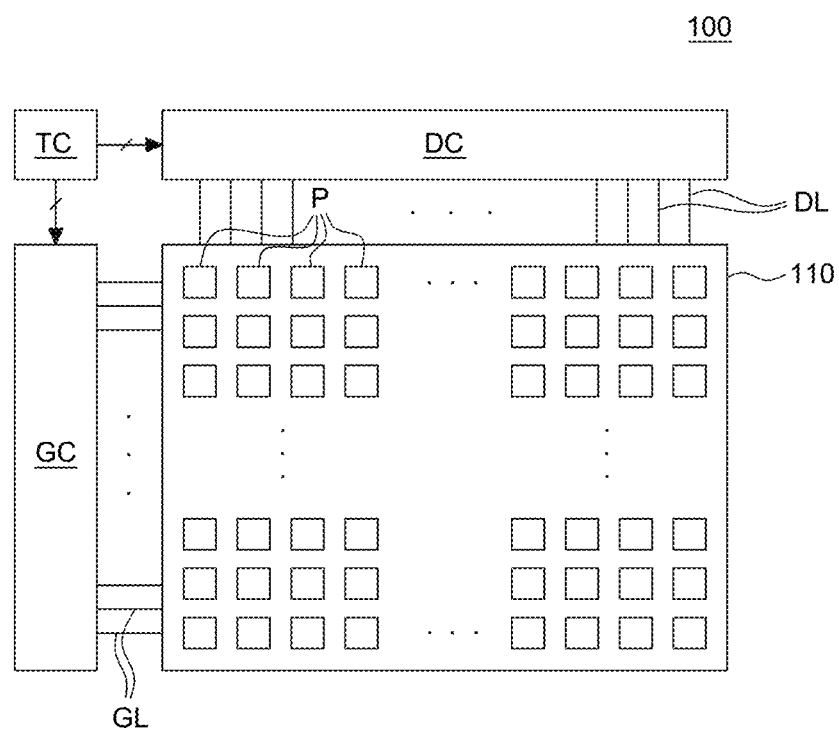
FIG. 1 is a schematic view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
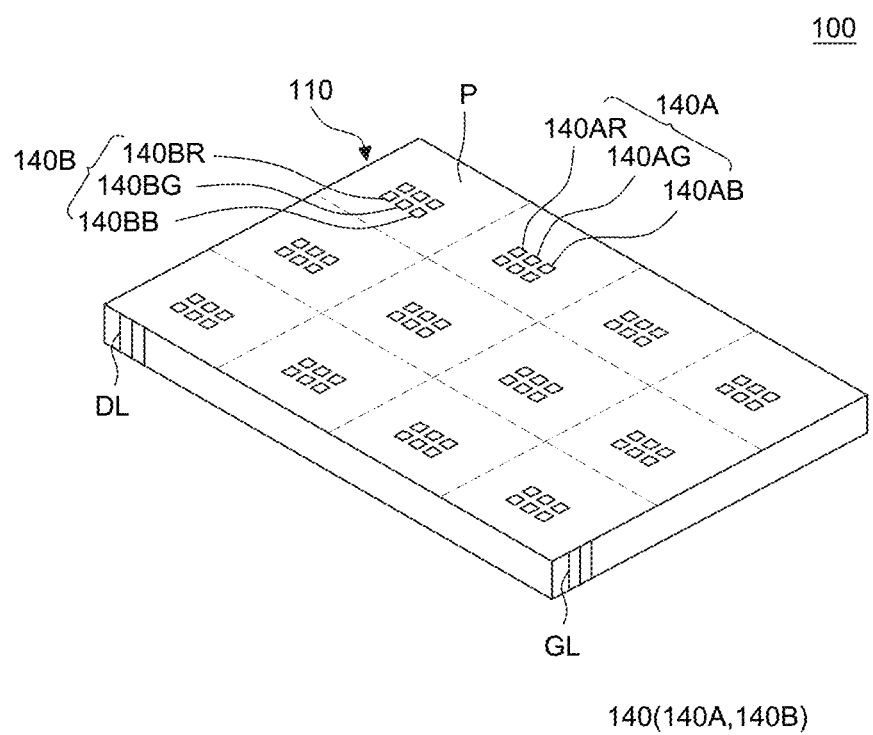
FIG. 2 is a schematic perspective view of a display device according to an exemplary embodiment of the present disclosure.

FIG. 1 is a schematic view of a display device according to an exemplary embodiment of the present disclosure. FIG. 2 is a schematic perspective view of a display device according to an exemplary embodiment of the present disclosure. Referring to FIG. 1, a light emitting display device 100 includes a substrate 111, a gate driver GC, a data driver DC, and a timing controller TC.

A display panel 110 is a panel for displaying images. The display panel 110 may include various circuits, wiring lines, and light emitting diodes disposed on the substrate 111. The display panel 110 is divided by a plurality of data lines DL and a plurality of gate lines GL intersecting each other and may include a plurality of unit pixels P connected to the plurality of data lines DL and the plurality of gate lines GL. The display panel 110 may include a display area defined by a plurality of unit pixels P and a non-display area in which various signal lines or pads are formed. The display panel 110 may include a light emitting diode (LED) as a light emitting element and as the light emitting diode (LED), a micro light emitting diode having a size of 100 μm or smaller may be used.

The timing controller TC receives timing signals such as a vertical synchronization signal, a horizontal synchronization signal, a data enable signal, or a dot clock by means of a receiving circuit such as an LVDS or TMDS interface connected to a host system. The timing controller TC generates timing control signals based on the input timing signal to control the data driver DC and the gate driver GC.

The data driver DC is connected to the plurality of data lines DL of the display panel 110 and supplies a data voltage Vdata to the plurality of unit pixels P. The data driver DC may include a plurality of source drive ICs (integrated circuits). The plurality of source drive ICs may be supplied with digital video data RGB and a source timing control signal DDC from the timing controller TC. The plurality of source drive ICs converts digital video data RGB into a gamma voltage in response to the source timing control signal DDC to generate a data voltage Vdata and supply the data voltage Vdata through the plurality of data lines DL of the display panel 110. The plurality of source drive ICs may be connected to the plurality of data lines DL of the display panel 110 by a chip on glass (COG) process or a tape automated bonding (TAB) process. Further, the plurality of source drive ICs is formed on the display panel 110 or is formed on a separate PCB substrate to be connected to the display panel 110.

The gate driver GC is connected to the plurality of gate lines GL of the display panel 110 and supplies a gate signal to the plurality of unit pixels P. The gate driver GC may include a level shifter and a shift register. The level shifter shifts a level of a clock signal CLK input at a transistor-transistor-logic (TTL) level from the timing controller TC and then supplies the clock signal CLK to the shift register. The shift register may be formed in the non-display area of the display panel 110, by a GIP manner, but is not limited thereto. The shift register is configured by a plurality of stages which shifts and outputs the gate signal, in response to the clock signal CLK and the driving signal. The plurality of stages included in the shift register may sequentially output the gate signal through a plurality of output terminals.

Referring to FIG. 2, the light emitting diode 140 is disposed in each pixel P of the display device 100 according to the exemplary embodiment of the present disclosure. The pixel P is an individual unit which emits light and may include a plurality of light emitting diodes and a plurality of pixel circuits which individually drives the plurality of light emitting diodes.

The light emitting diode 140 includes a first light emitting diode 140A and a second light emitting diode 140B. The first light emitting diode 140A and the second light emitting diode 140B are disposed in a line in the pixel P of the display panel 110 and the first light emitting diode 140A and the second light emitting diode 140B are adjacent to each other.

The first light emitting diode 140A is disposed in a first row of the pixel P. The first light emitting diode 140A is configured by elements which emit different color light. For example, the first light emitting diode 140A includes a first red light emitting diode 140AR, a first green light emitting diode 140AG, and a first blue light emitting diode 140AB.

The second light emitting diode 140B is disposed in a second row of the pixel P. The second light emitting diode 140B is configured by elements which emit the same color light as the first light emitting diode 140A. For example, the second light emitting diode 140B includes a second red light emitting diode 140BR, a second green light emitting diode 140BG, and a second blue light emitting diode 140BB. However, it is not limited thereto and the first light emitting diode 140A and the second light emitting diode 140B may further include a white light emitting diode which implements a white sub pixel. Further, the type and the number of light emitting diodes which configure the first light emitting diode 140A and the second light emitting diode 140B may be configured in various ways according to the exemplary embodiment. In the present specification, when two light emitting diodes emit the same color light, it means that the light emitting diodes are manufactured to have the same design to emit the same color light. For example, when the material which configures the light emitting diodes and the laminated structure are the same, it may be defined that two light emitting diodes emit the same color light. At this time, even though the color of the light emitted by the light emitting diode is changed due to the manufacturing deviation of the light emitting diode or a long used time, if it is determined that they are designed to emit the same color light at the initial manufacturing, it may be defined that two light emitting diodes emit the same color light. Referring to FIG. 2, the exemplary embodiment of the present disclosure has been described that the pixel P includes the first light emitting diode 140A and the second light emitting diode 140B, but it is not necessarily limited thereto. For example, the pixel P may include only the first light emitting diode 140A or the second light emitting diode 140B.

In the meantime, the gate driver GC, the data driver DC, and the timing controller TC are disposed below the display panel 110 and a plurality of wiring lines such as the gate line GL and the data line DL may be disposed on the side surface of the display panel 110.

Figure 3:
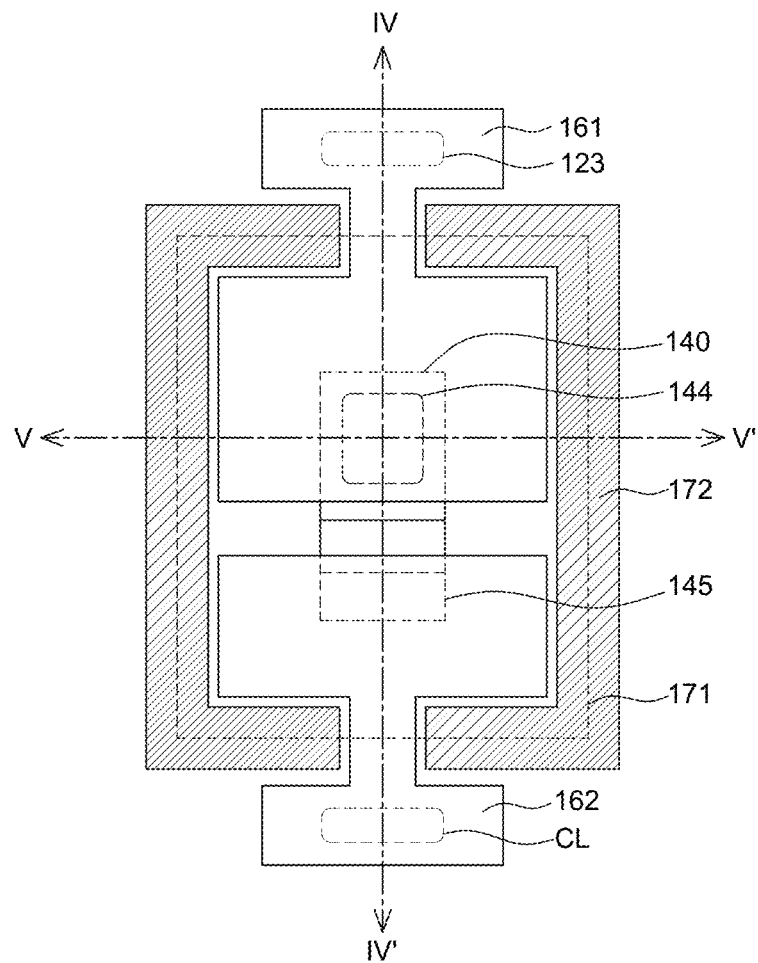
FIG. 3 is a plan view of a display device according to an exemplary embodiment of the present disclosure.
Figure 4:
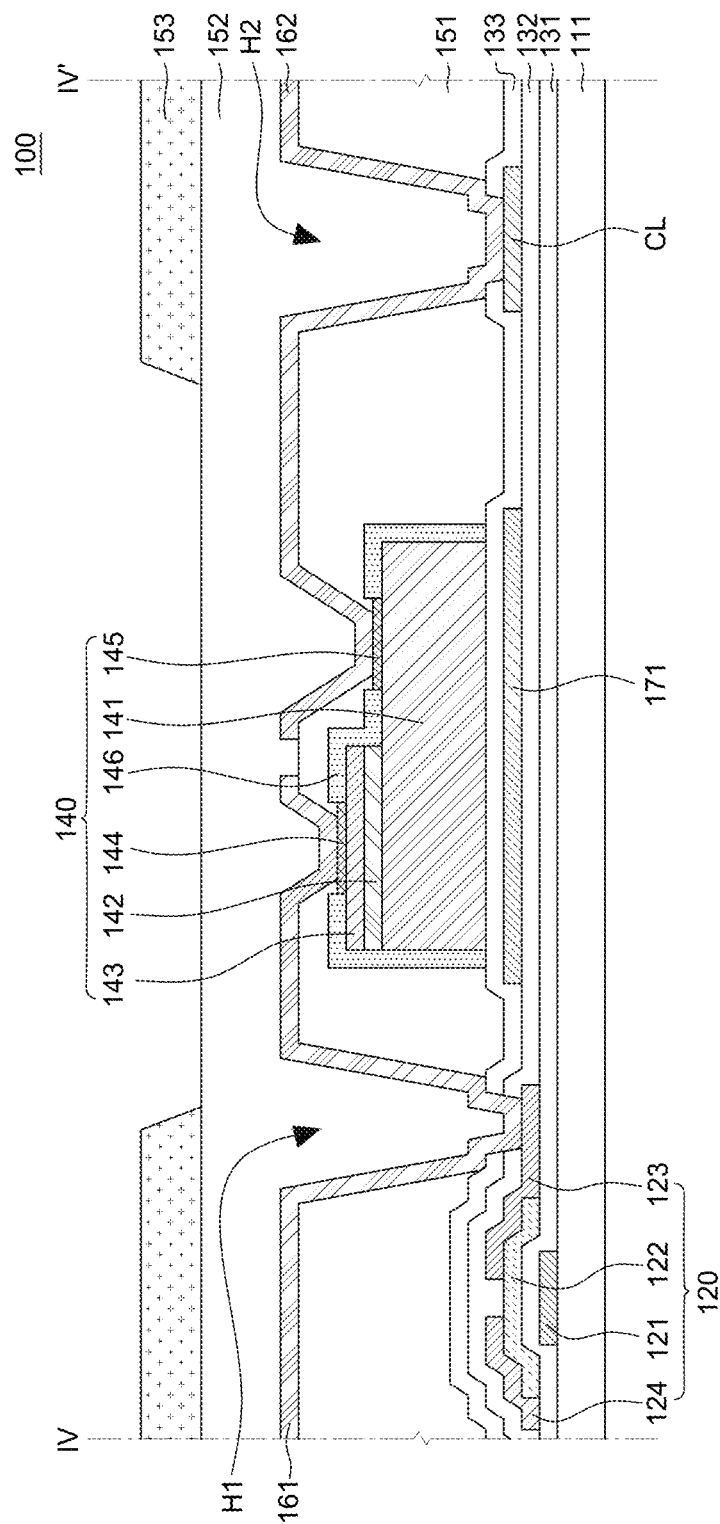
FIG. 4 is a cross-sectional view of a display device according to an exemplary embodiment of the present disclosure.
Figure 5:
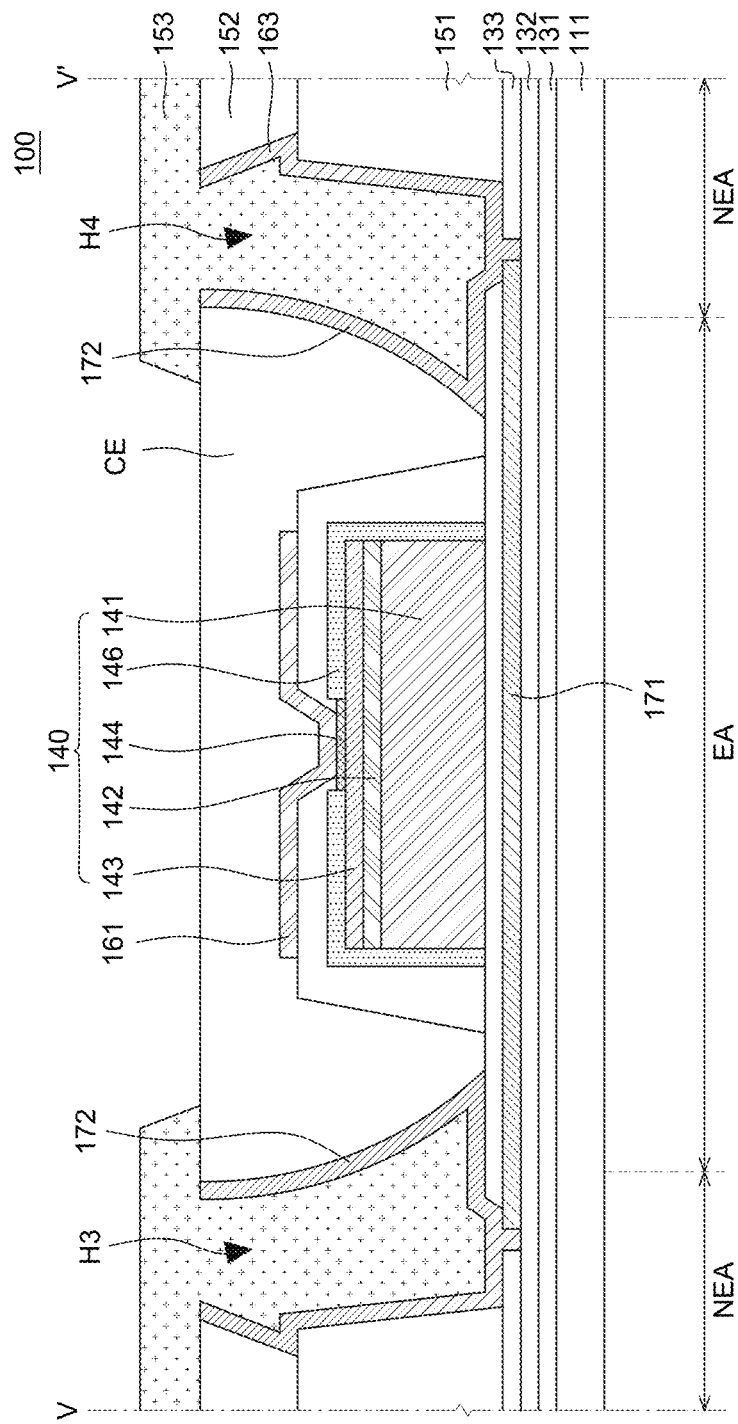
FIG. 5 is a cross-sectional view of a display device according to an exemplary embodiment of the present disclosure.

FIG. 3 is a plan view of a display device according to an exemplary embodiment of the present disclosure. FIGS. 4 and 5 are cross-sectional views of a display device according to an exemplary embodiment of the present disclosure. Specifically, FIG. 3 is a plan view for a part of the pixel P and specifically, is a plan view illustrating a structure of a light emitting diode 140 and a periphery of the light emitting diode 140. Further, FIG. 4 is a vertical cross-sectional view from IV to IV' of the pixel P illustrated in FIG. 3. As illustrated in FIG. 4, a display device 100 according to an exemplary embodiment of the present disclosure includes a substrate 111, a semiconductor element 120, a gate insulating layer 131, a passivation layer 132, a first reflective layer 171, an adhesive layer 133, a light emitting diode 140, a first insulating layer 151, and connecting electrodes 161 and 162.

The substrate 111 is a substrate which supports various functional elements and may be an insulating material. For example, the substrate 111 may include glass or polyimide. When the substrate 111 has a flexibility, the substrate 111 may further include a back plate coupled to a rear surface of the substrate 111 to reinforce the substrate 111. The back plate may include a plastic material, and for example, may include a polyethylene terephthalate material.

The semiconductor element 120 is disposed on the substrate 111. The semiconductor element 120 may be used as a driving element of the display device 100. The semiconductor element 120 may be a thin film transistor (TFT), an N-channel metal oxide semiconductor (NMOS), a P-channel metal oxide semiconductor (PMOS), a complementary metal oxide semiconductor (CMOS), or a field effect transistor FET, but is not limited thereto. In the following description, it is assumed that the plurality of semiconductor elements 120 is thin film transistors, but is not limited thereto.

The semiconductor element 120 includes a gate electrode 121, an active layer 122, a source electrode 123, and a drain electrode 124.

The gate electrode 121 is formed on the substrate 111. The gate electrode 121 may be formed of a conductive material such as copper (Cu), aluminum (Al), molybdenum (Mo), titanium (Ti), or an alloy thereof, but is not limited thereto.

The gate insulating layer 131 is disposed on the gate electrode 121. The gate insulating layer 131 is a layer for insulating the gate electrode 121 from the active layer 122 and may be formed of an insulating material. For example, the gate insulating layer 131 may be configured by a single layer or a double layer of silicon oxide SiOx or silicon nitride SiNx, but is not limited thereto.

The active layer 122 is disposed on the gate insulating layer 131. For example, the active layer 122 may be formed of an oxide semiconductor, amorphous silicon, or polysilicon, but is not limited thereto.

The source electrode 123 and the drain electrode 124 are disposed on the active layer 122 to be spaced apart from each other. The source electrode 123 and the drain electrode 124 may be electrically connected to the active layer 122. The source electrode 123 and the drain electrode 124 may be formed of a conductive material such as copper (Cu), aluminum (Al), molybdenum (Mo), titanium (Ti), or an alloy thereof, but are not limited thereto.

The passivation layer 132 is disposed on the semiconductor element 120. The passivation layer 132 is provided to protect elements disposed below the passivation layer 132, for example, the semiconductor element 120. The passivation layer 132 may be configured by a single layer or a double layer of silicon oxide SiOx or silicon nitride SiNx, but is not limited thereto. The passivation layer 132 may include a first hole H1 for electrically connecting the semiconductor element 120 and the first connecting electrode 161 and a second hole H2 for electrically connecting a common line CL and the second connecting electrode 162.

A buffer layer may be disposed between the substrate 111 and the semiconductor element 120. The buffer layer may minimize diffusion of moisture or impurities from the substrate 111 to the upper portion of the substrate 111. The buffer layer may be configured by a single layer or a double layer of silicon oxide SiOx or silicon nitride SiNx, but is not limited thereto.

The gate line GL is disposed on the gate insulating layer 131. The gate line GL may be disposed on the same layer as the gate electrode 121 and the gate line GL may be formed of the same material as the gate electrode 121. The data line DL may also be formed with the same purpose as the gate line GL and extend in a different direction from the gate line GL.

The common line CL is disposed on the gate insulating layer 131. The common line CL is a wiring line for applying a common voltage to the light emitting diode 140 and may be disposed to be spaced apart from the gate line GL or the data line DL. The common line CL may extend in the same direction as the gate line GL or the data line DL. The common line CL may be formed of the same material as the source electrode 123 and the drain electrode 124 or may be formed of the same material as the gate electrode 121.

The first reflective layer 171 is disposed on the passivation layer 132. The first reflective layer 171 is a layer for improving a luminous efficiency of the light emitting diode 140. The first reflective layer 171 reflects light directed to the substrate 111, among light emitted from the light emitting diode 140, toward the upper portion of the display device 100 to be output to the outside of the display device 100. The first reflective layer 171 may be formed of a metal material having a high reflectance, and for example, may include silver (Ag) or aluminum (Al). In the meantime, pure silver (Ag) may react with oxygen or nitrogen so that the reflectance may be lowered. Therefore, the first reflective layer 171 may be formed of a multiple layer of ITO/Ag/ITO or formed by adding impurities such as palladium (Pd) or copper (Cu).

The adhesive layer 133 is disposed on the first reflective layer 171. The adhesive layer 133 is a layer for fixing the light emitting diode 140 onto the substrate 111 and may electrically insulate the first reflective layer 171 including a metal material from the light emitting diode 140. However, the adhesive layer is not necessarily limited thereto. When the light emitting diode is a vertical type in which one electrode therebelow is exposed, the adhesive layer 133 may include a conductive material so as to electrically connect one electrode of the light emitting diode to the first reflective layer 171. The adhesive layer 133 may be formed of a thermosetting material or a photo curing material and may be any one selected from adhesive polymer, epoxy resist, UV resin, a polyimide-based material, an acrylate-based material, an urethane-based material, and polydimethylsiloxane (PDMA), but is not limited thereto.

The adhesive layer 133 may include a first hole H1 for electrically connecting the semiconductor element 120 and the first connecting electrode 161 and a second hole H2 for electrically connecting a common line CL and the second connecting electrode 162. In this case, the first hole H1 and the second hole H2 included in the adhesive layer 133 may have a larger cross-sectional area than that of the first hole H1 and the second hole H2 included in the passivation layer 132. In the meantime, as illustrated in FIG. 4, the adhesive layer 133 may be disposed on the entire surface of the substrate 111, but is not necessarily limited thereto. In some exemplary embodiments, the adhesive layer 133 may be formed to have an island shape so as to include a part overlapping the light emitting diode 140. That is, the adhesive layer 133 may completely overlap the light emitting diode 140, but may be disposed to be smaller than the first reflective layer 171.

The plurality of light emitting diodes 140 is formed on a separate growth substrate and then moves to the substrate 111 through a substrate separating process. For the substrate separating process of separating the plurality of light emitting diodes 140 from the growth substrate, a laser lift off (LLO) process or a chemical lift off (CLO) process may be applied. In this case, the light emitting diode 140 is separated from the growth substrate so that a part of the encapsulating layer 146 which is adjacent to the growth substrate may be removed together with the growth substrate.

The light emitting diode 140 is disposed on the adhesive layer 133 so as to overlap the first reflective layer 171. The light emitting diode 140 may include an n-type layer 141, an active layer 142, a p-type layer 143, an n electrode 145, a p electrode 144, and an encapsulating layer 146. Even though it is described in the present specification that the light emitting diode 140 has a lateral structure in which the n electrode 145 and the p electrode 144 are disposed in parallel on an upper surface of the light emitting diode 140, it is not necessarily limited thereto. For example, the light emitting diode 140 may have a vertical structure in which the n electrode 145 and the p electrode 144 are disposed on different surfaces or a flip structure in which the n electrode 145 and the p electrode 144 are disposed on the same surface.

The n-type layer 141 is a semiconductor layer in which free electrons having a negative charge move as carriers to generate an electric current and may be formed of an n-GaN-based material. The n-GaN-based material may be GaN, AlGaN, InGaN, or AlInGaN and Si, Ge, Se, Te, or C may be used as an impurity used for doping the n-type layer 141. Further, in some cases, a buffer layer, such as an undoped GaN-based semiconductor layer, may be additionally formed between a growth substrate and the n-type layer 141.

The active layer 142 is disposed on the n-type layer 141 and may have a multi quantum well (MQW) structure having a well layer and a barrier layer having a higher band gap than that of the well layer. For example, the active layer 142 may have a multi quantum well structure such as InGaN/GaN.

The p-type layer 143 is a semiconductor layer in which holes having a positive charge move as carriers to generate an electric current and may be formed of a p-GaN-based material. The p-GaN-based material may be GaN, AlGaN, InGaN, or AlInGaN and Mg, Zn, or Be may be used as an impurity used for doping the p-type layer 143.

The p electrode 144 is disposed on the p-type layer 143 to form ohmic contact. The p electrode 144 may be a transparent conductive material such as indium tin oxide (ITO) or indium zinc oxide (IZO), but is not limited thereto. Further, the n electrode 145 is disposed on the n-type layer 141 for ohmic contact. The n electrode 145 may be formed of the same material as the p electrode 144.

The encapsulating layer 146 is disposed on the n-type layer 141 and the p-type layer 143 to protect the n-type layer 141 and the p-type layer 143. The encapsulating layer 146 may be formed of SiO2, Si3N4, or resin. The encapsulating layer 146 may be disposed on the entire surface of the light emitting diode 140 excluding the lower portion of the light emitting diode 140. However, parts of the p electrode 144 and the n electrode 145 are exposed by the encapsulating layer 146 and the p electrode 144 and the n electrode 145 may be in ohmic contact with the first connecting electrode 161 and the second connecting electrode 162, respectively, through the exposed area.

The first insulating layer 151 is disposed on the semiconductor element 120. The first insulating layer 151 may be formed of an organic material such as photo acryl, polyimide, benzocyclobutene resin, or acrylate resin, but is not limited thereto.

The first insulating layer 151 may be disposed so as to cover the entire surface of the substrate 111. Further, the first insulating layer 151 is disposed so as to be adjacent to the side surface of the light emitting diode 140 so that the light emitting diode 140 may be firmly fixed onto the substrate 111. Further, some scratches or cracks may be generated in the encapsulating layer 146 on the side surface of the light emitting diode 140 so that the light emitting diode 140 may be disposed on the substrate 111 while exposing a part of the n-type layer 141. The first insulating layer 151 is disposed to be in close contact with the side surface of the light emitting diode 140 to electrically insulate the n-type layer 141 of the light emitting diode 140 from the p-type layer 143.

The first insulating layer 151 may include a first hole H1 for electrically connecting the semiconductor element 120 and the first connecting electrode 161 and a second hole H2 for electrically connecting the common line CL and the second connecting electrode 162. In this case, the first hole H1 and the second hole H2 included in the first insulating layer 151 may have a larger cross-sectional area than that of the first hole H1 and the second hole H2 included in the adhesive layer 133.

The first insulating layer 151 may planarize a space between the plurality of light emitting diodes 150. The first insulating layer 151 compensates the step on the substrate 111 due to the semiconductor element 120 and the first reflective layer 171 to allow smooth ohmic contact between the connecting electrodes 161 and 162 and the semiconductor element 120 or the common line CL.

The first insulating layer 151 may be thicker than light emitting diodes 140. Therefore, the first insulating layer 151 may overlap an upper portion of the light emitting diode 140. Referring to FIG. 4, the first insulating layer 151 may cover the encapsulating layer 146 between the p electrode 144 and the n electrode 145. However, the first insulating layer 151 may not be formed on at least a part of the p electrode 144 to connect the p electrode 144 and the first connecting electrode 161 to each other. Further, the first insulating layer 151 may not be formed on at least a part of the n electrode 145 to connect the n electrode 145 and the second connecting electrode 162 to each other The first connecting electrode 161 is disposed on the first insulating layer 151 and the light emitting diode 140. The first connecting electrode 161 electrically connects the p electrode 144 of the light emitting diode 140 and the semiconductor element 120. Referring to FIG. 4, the first connecting electrode 161 is connected to the source electrode 123 of the semiconductor element 120 through the first hole H1. When the display device 100 is a top emission type, the first connecting electrode 161 may be formed of a transparent conductive material and when the display device 100 is a bottom emission type, the first connecting electrode 161 may be formed of a reflective conductive material. The transparent conductive material may be indium tin oxide (ITO) or indium zinc oxide (IZO), but is not necessarily limited thereto. The reflective conductive material may be Al, Ag, Au, Pt, or Cu, but is not necessarily limited thereto.

The second connecting electrode 162 is disposed on the first insulating layer 151 and the light emitting diode 140. The second connecting electrode 162 electrically connects the n electrode 145 of the light emitting diode 140 and the common line CL. The second connecting electrode 162 is connected to the common line CL through the second hole H2. The second connecting electrode 162 may be formed of the reflective conductive material or may be formed of the same material as the first connecting electrode 161. The reflective conductive material may be Al, Ag, Au, Pt, or Cu, but is not necessarily limited thereto.

Referring to FIGS. 3 and 4, the first connecting electrode 161 and the second connecting electrode 162 are physically separated on the encapsulating layer 146 and the first insulating layer 151 between the p electrode 144 and the n electrode 145. As described above, the p-type layer 143 and the n-type layer 141 are electrically insulated so that the light emitting diode 140 may normally emit light.

FIG. 5 is a vertical cross-sectional view from V to V' of the pixel P illustrated in FIG. 3. The only difference between a display device 100 of FIG. 4 and the display device 100 of FIG. 5 is a second insulating layer 152 and a third insulating layer 153, but the other configuration is substantially the same, so that a redundant description will be omitted.

The second insulating layer 152 is disposed on the substrate 111. The second insulating layer 152 may be formed of a negative photoresist material. The second insulating layer 152 may be formed on the light emitting diode 140 and the first insulating layer 151 and completely cover the light emitting diode 140 and the first insulating layer 151. Specifically, referring to FIG. 5, the second insulating layer 152 is disposed to enclose the light emitting diode 140. That is, the second insulating layer 152 may be disposed such that the light emitting diode 140 is included in the second insulating layer 152. In the meantime, the second insulating layer 152 may be disposed on the first insulating layer 151 so as to overlap the first hole H1, the second hole H2, and the semiconductor element 120.

In the present specification, for better understanding, in the cross-sectional view illustrated in FIG. 5, the second insulating layer 152 disposed in the central portion is described as a light collecting structure CE. That is, the second insulating layer 152 may include a light collecting structure CE. Referring to FIG. 5, the light collecting structure CE may be disposed so as to overlap the peripheries of the light emitting diode 140 and the first insulating layer 152, and upper portions of the light emitting diode 140 and the first insulating layer 151. Further, the second insulating layer 152 includes a third hole H3 and a fourth hole H4 and the light collecting structure CE may be distinguished from the second insulating layer 152 with the third hole H3 and the fourth hole H4 as borders.

As illustrated in the cross-sectional view of FIG. 5, the light collecting structure CE may have an inverted dome shape. That is, an angle between a normal line of the substrate 111 and a side surface of the light collecting structure CE may be an acute angle and thus the side surface of the light collecting structure CE may have a reverse tapered angle. The horizontal cross-sectional area of the light collecting structure CE may be configured to be upwardly increased from a surface close to the substrate 111.

The pixel P may be divided into an emission area EA and a non-emission area NEA. In the emission area EA, the light emitting diode 140 and the light collecting structure CE are disposed and light generated from the light emitting diode 140 is guided to the upper portion of the light emitting diode 140. In the non-emission area NEA, the semiconductor element 120, the first insulating layer 151, and the second insulating layer 152 are disposed.

The third hole H3 and the fourth hole H4 included in the second insulating layer 152 may be disposed so as to overlap the emission area EA and the non-emission area NEA. An angle formed by the side surface of the first insulating layer 151 disposed in the non-emission area NEA and the normal line of the substrate 111 may be an obtuse angle. That is, the side surface of the first insulating layer 151 disposed in the non-emission area NEA may form an obtuse angle with a bottom surface of the third hole H3 so that the side surface of the first insulating layer 151 may form a right tapered angle. In the non-emission area NEA, the second insulating layer 152 disposed on the first insulating layer 151 may form a reverse tapered angle. That is, an angle formed by the side surface of the second insulating layer 152 and the upper surface of the first insulating layer 151 may be an acute angle.

The second reflective layer 172 is disposed in the third hole H3 and the fourth hole H4. Light directed to the side direction of the light emitting diode 140, among light emitted from the light emitting diode 140 is reflected to the upper portion of the display device 100 by the second reflective layer 172 to be output to the outside of the display device 100. The second reflective layer 172 is disposed along the side surface of the light collecting structure CE. That is, the second reflective layer 172 extends along the side surface of the light collecting structure CE to the same height as the upper surface of the light collecting structure CE. Accordingly, light emitted from the light emitting diode 140 is guided to be collected toward an upper direction of the emission area EA. Accordingly, the luminous efficiency of the emission area EA may be improved and a power consumed by the display panel 110 may be efficiently controlled.

The second reflective layer 172 may be electrically connected to the first reflective layer 171. Referring to FIG. 5, even though it is illustrated that the second reflective layer 172 is in contact with both ends of the first reflective layer 171, it is not necessarily limited thereto. For example, a width of the first reflective layer 171 may be extended to be longer than a length illustrated in FIG. 5 and the third hole H3 and the fourth hole H4 may expose only the upper surface of the first reflective layer 171. In this case, the second reflective layer 172 may be in electrically contact with upper surfaces of both ends of the first reflective layer 171. In some exemplary embodiments, the first reflective layer 171, the second reflective layer 172, and the common line CL may be electrically connected or the second reflective layer 172 may be applied with a voltage which is different from a constant voltage applied to the common line CL or the second reflective layer 172 may be maintained in an electrically floated state.

Referring to FIG. 3, the second reflective layer 172 according to the exemplary embodiment of the present disclosure is spaced apart from the light emitting diode 140 with a predetermined distance therebetween to enclose the light emitting diode 140. In some exemplary embodiments, a horizontal cross-sectional shape of the second reflective layer 172 may be a circle and as illustrated in FIG. 3, may be an open loop in which a part of both ends is broken.

Further, a part of the second reflective layer 172 disposed on one side of the light emitting diode 140 may be symmetrical to a part of the second reflective layer 172 disposed on the other side of the light emitting diode 140 with respect to the light emitting diode 140. The second reflective layer 172 disposed on one side of the light emitting diode 140 may have a "U" shape or a "C" shape. In the meantime, the third hole H3 included in the second insulating layer 152 may have the same shape as the left side of the second reflective layer 172 illustrated in FIG. 3 and the fourth hole H4 included in the second insulating layer 152 may have the same shape as the right side of the second reflective layer 172 illustrated in FIG. 3.

Referring to FIG. 5, a third insulating layer 153 is disposed on the third hole H3 and the fourth hole H4. The third insulating layer 153 may overlap the third hole H3 and the fourth hole H4 of the non-emission area NEA or overlap a part of the emission area EA, but is not limited thereto. For example, the third insulating layer 153 may overlap only the non-emission area NEA.

The third insulating layer 153 may be formed of an insulating material, and may include a black material or a light absorbing material. For example, the third insulating layer 153 may be formed of a carbon-based mixture and specifically, include carbon black. Some of light reaching the third reflective layer 172 may pass through the third reflective layer 172 to be output to the non-emission area NEA so that the luminous efficiency of the display device 100 may deteriorate. Accordingly, the third insulating layer 153 is disposed in the third hole H3 and the fourth hole H4 to increase the light collection rate of the emission area EA and further improve the luminous efficiency. Further, heat concentrated on the light emitting diode 140 and the second reflective layer 172 is absorbed by the third insulating layer 153 to be output to the outside and thus the lifespan of the display device 100 may be extended. In the meantime, referring to FIG. 4, the third insulating layer 153 may be formed on the non-emission area NEA. The third insulating layer 153 may be formed on the second insulating layer 152 of the non-emission area NEA and may overlap the first hole H1 and the second hole H2. Therefore, the color mixture between the plurality of pixels P is minimized, which may improve a quality of the display device 100.

Figure 6:
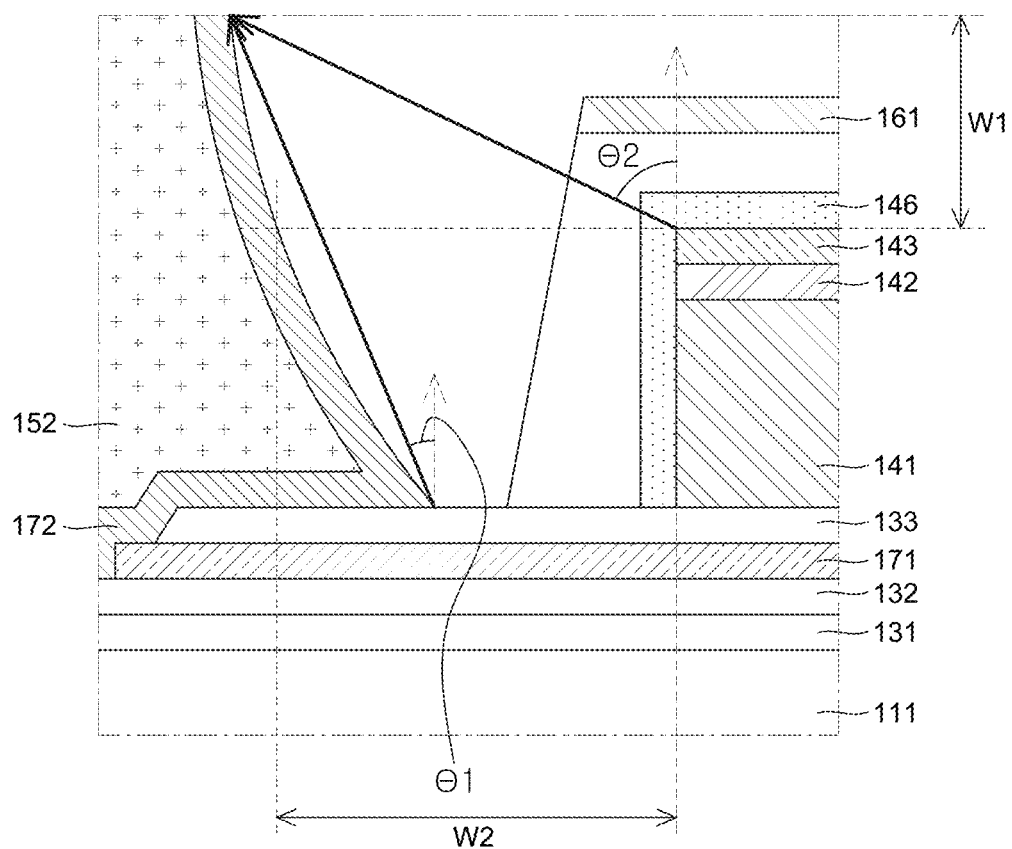
FIG. 6 is an enlarged cross-sectional view of a display device according to an exemplary embodiment of the present disclosure.

FIG. 6 is an enlarged cross-sectional view of a display device according to an exemplary embodiment of the present disclosure. FIG. 7 is a table showing an experiment result of various exemplary embodiments and comparative embodiments of the present disclosure. FIG. 6 is a view for explaining a design guide of the light collecting structure CE and the second reflective layer 172 and the structure thereof is substantially the same as the display device 100 illustrated in FIGS. 3 to 5 so that a redundant description will be omitted. FIG. 7 is a table showing a result obtained by conducting the experiment for a gradient of the second reflective layer 172.

Referring to FIG. 7, an experiment result for a total light quantity, a total light quantity ratio, a front luminance, and a front luminance ratio of a comparative embodiment A in which a second reflective layer 172 which is a side reflector is not provided and various experimental embodiments B to G in which the second reflective layer 172 has various gradients. At this time, the gradient is a first angle 61 between an imaginary normal line of the substrate 111 and the second reflective layer 172 and as illustrated in FIG. 6, a reference line of the second reflective layer 172 with respect to the first angle 61 is set by a linear line connecting both ends of the side surface of the light collecting structure CE. Referring to the experiment result of FIG. 7, when the first angle θ1 was 30 degrees, the maximum front luminance ratio was measured and then was measured in the order of 60 degrees and 50 degrees. Accordingly, the gradient of the second reflective layer 172 may be set such that the first angle θ1 has a value between 30 degrees and 60 degrees. That is, an angle of the side surface of the light collecting structure CE and the bottom surface of the light collecting structure CE may be desirably designed to have a value between the 120 degrees and 150 degrees.

Referring to FIG. 6, when a linear distance from the p-type layer 143 of the light emitting diode 140 to the upper surface of the light collecting structure CE1 is defined as a first length W1 and a linear distance from the p-type layer 143 to the second reflective layer 172 is defined as a second length W2, the first length W1 may be desirably designed to be equal to or larger than the second length W2. Specifically, a height of the second reflective layer 172 and the height (or a thickness) of the light collecting structure CE may be desirably designed in consideration of a refractive index and a total reflection critical angle of the light collecting structure CE. In order to minimize a phenomenon that light emitted from the light emitting diode 140 is totally reflected from the upper surface of the light collecting structure CE to be trapped in the light collecting structure CE, the second length W2 may be desirably formed to be large. For example, since a refractive index of a normal organic material is 1.5, if it is assumed that the refractive index of the light collecting structure CE is 1.5, a total reflection critical angle is approximately 42 degrees. Accordingly, the height of the second reflective layer 172 may be desirably designed such that the second angle θ2 illustrated in FIG. 6 is larger than 42 degrees. That is, the thickness of the light collecting structure CE and the second length W2 may be desirably designed such that the second angle θ2 illustrated in FIG. 6 is larger than 42 degrees. At this time, the second angle θ2 is an angle formed by a linear line connecting a corner of the p-type layer 143 of the light emitting diode 140 and an end of the second reflective layer 172 and an imaginary normal line of the substrate 111.

FIGS. 8A to 8E are schematic process diagrams for explaining a manufacturing method of a display device according to an exemplary embodiment of the present disclosure. FIGS. 9A to 9E are schematic process diagrams for explaining a manufacturing method of a display device according to another exemplary embodiment of the present disclosure.

The process diagrams illustrated in FIGS. 8A to 8E illustrate a manufacturing process of the display device 100 of FIGS. 3 to 6 and the structure thereof is substantially the same as the display device 100 of FIG. 5 so that a redundant description will be omitted. The process diagrams of FIGS. 8A to 8E are a process order of the display device 100 with respect to the vertical cross-sectional view of FIG. 5.

Figure 8A:
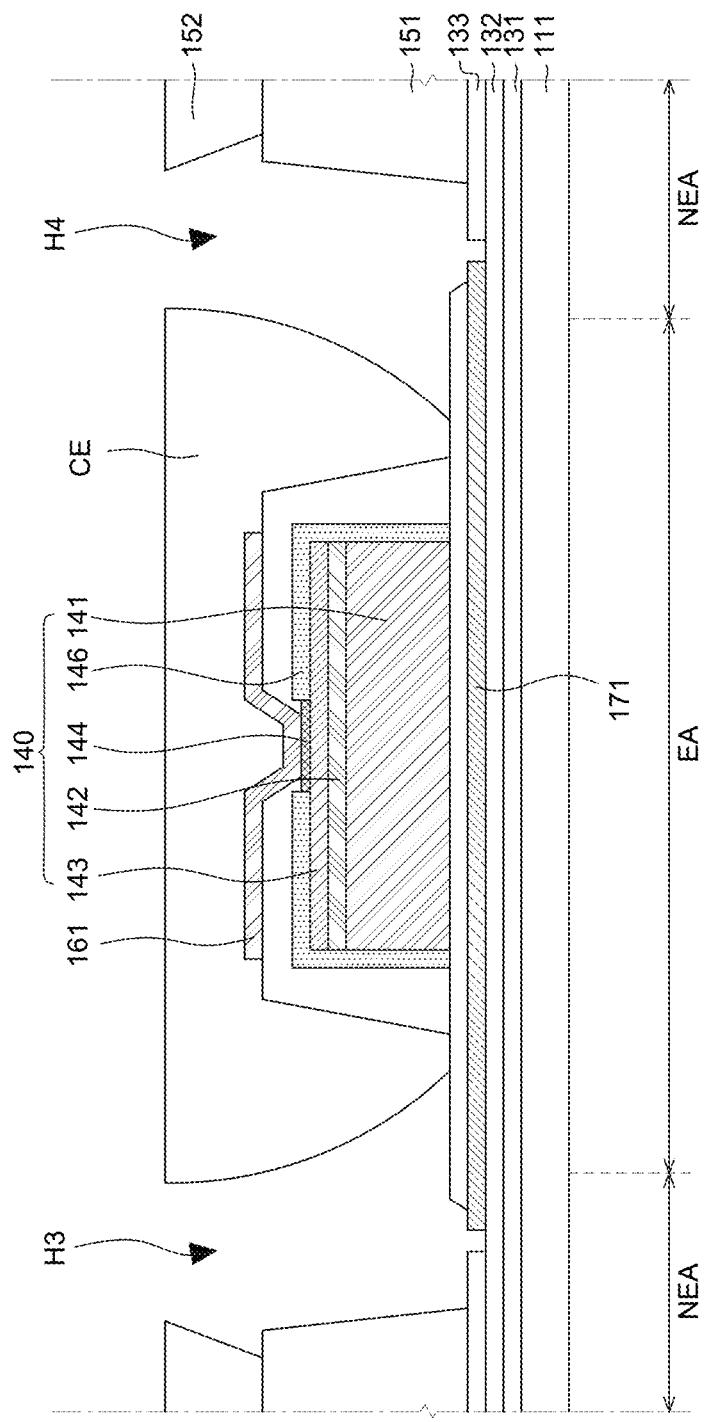
FIGS. 8A to 8E are schematic process diagrams for explaining a manufacturing method of a display device according to an exemplary embodiment of the present disclosure.

Referring to FIG. 8A, on a substrate 111 on which a gate insulating layer 131, a passivation layer 132, a first reflective layer 171, and an adhesive layer 133 are formed, a light emitting diode 140 is disposed and a first connecting electrode 161, a second connecting electrode 162, and a first insulating layer 151 are formed. The first insulating layer 151 is completed by forming the first insulating material layer on the substrate 111 and then removing a partial area. In the meantime, the first insulating material layer may be a negative photoresist and an organic material. Next, a hole is formed in the first insulating layer 151 in an area corresponding to a p electrode 144 and an n electrode 145 of the light emitting diode 140 and the first connecting electrode 161 and the second connecting electrode 162 are formed on the first insulating layer 151, the p electrode 144, and the n electrode 145, respectively. Next, a second insulating material layer is formed on the substrate 111. The second insulating material layer may be a material different from the first insulating material layer and may be an organic material having a negative property. That is, the second insulating material layer may be a negative photoresist. The second insulating material layer is formed on the entire surface of the substrate 111 so as to overlap the light emitting diode 140 and the first insulating layer 151.

Next, a third hole H3 and a fourth hole H4 are formed on the second insulating material layer. The second insulating material layer may be etched so that a side surface of the second insulating material layer exposed through the third hole H3 and the fourth hole H4 has a reverse tapered gradient. Accordingly, the second insulating layer 152 and the light collecting structure CE in which a side surface has a reverse tapered gradient may be formed. That is, the side surface of the second insulating layer 152 exposed on one side by the third hole H3 and the fourth hole H4 in the non-emission area NEA has a reverse tapered gradient. Further, the side surface of the light collecting structure CE exposed on one side by the third hole H3 and the fourth hole H4 in the emission area EA has a reverse tapered gradient. In other words, the light collecting structure CE may be formed to have an inverted dome shape. The reverse tapered gradient may be controlled by adjusting a light quantity of light which is irradiated onto the second insulating material layer, a development time, a baking time, and a baking temperature.

Figure 8B:
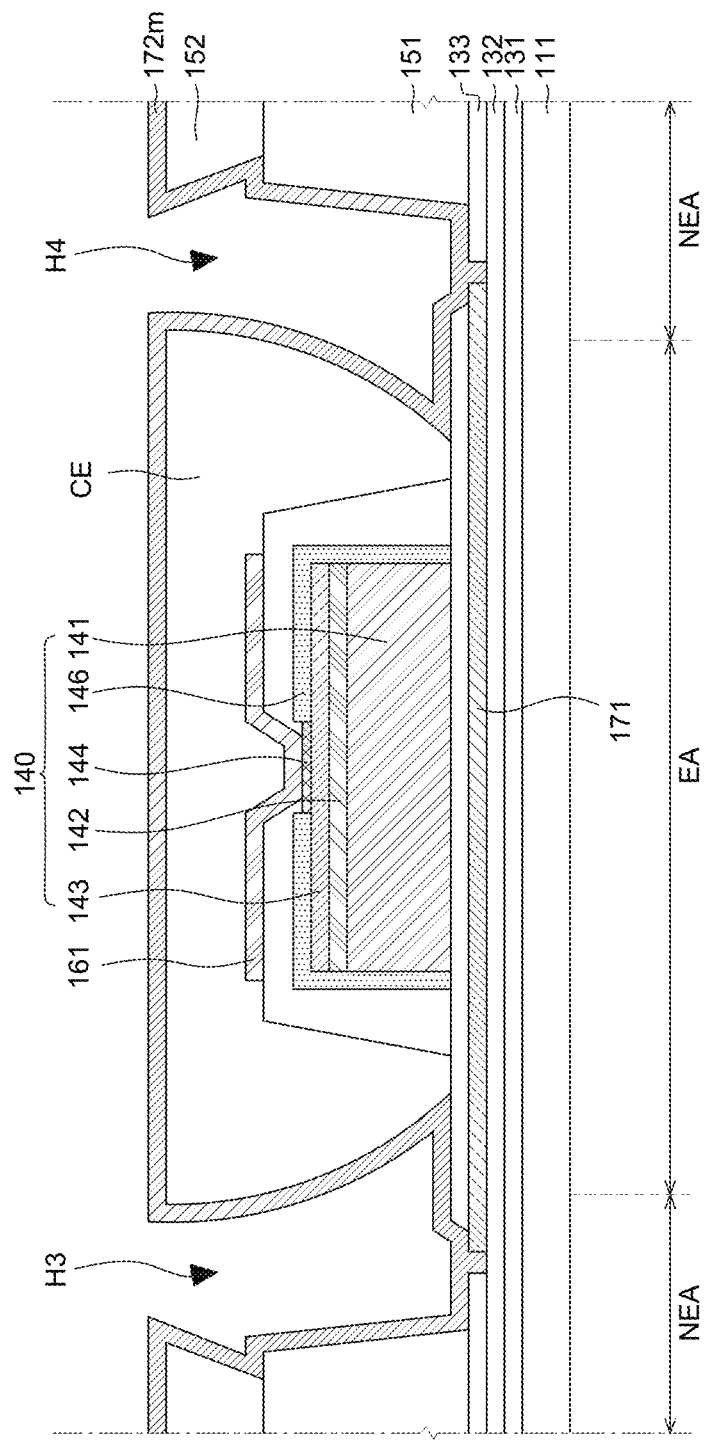

Next, referring to FIG. 8B, a reflective material layer 172m is formed on the substrate 111. Referring to FIG. 8B, the reflective material layer 172m is formed on the second insulating layer 152 and formed in the third hole H3 and the fourth hole H4. Specifically, the reflective material layer 172m may be desirably formed on the entire side surface of the light collecting structure CE to have a constant thickness. Further, the reflective material layer 172m may be formed on bottom surfaces of the third hole H3 and the fourth hole H4 and may be electrically connected to the first reflective layer 171. The reflective material layer 172m may be formed of a metal material having a high reflectivity. For example, the reflective material layer 172m may include silver (Ag) or aluminum (Al), and may be the same material as the first reflective layer 171.

Figure 8C:
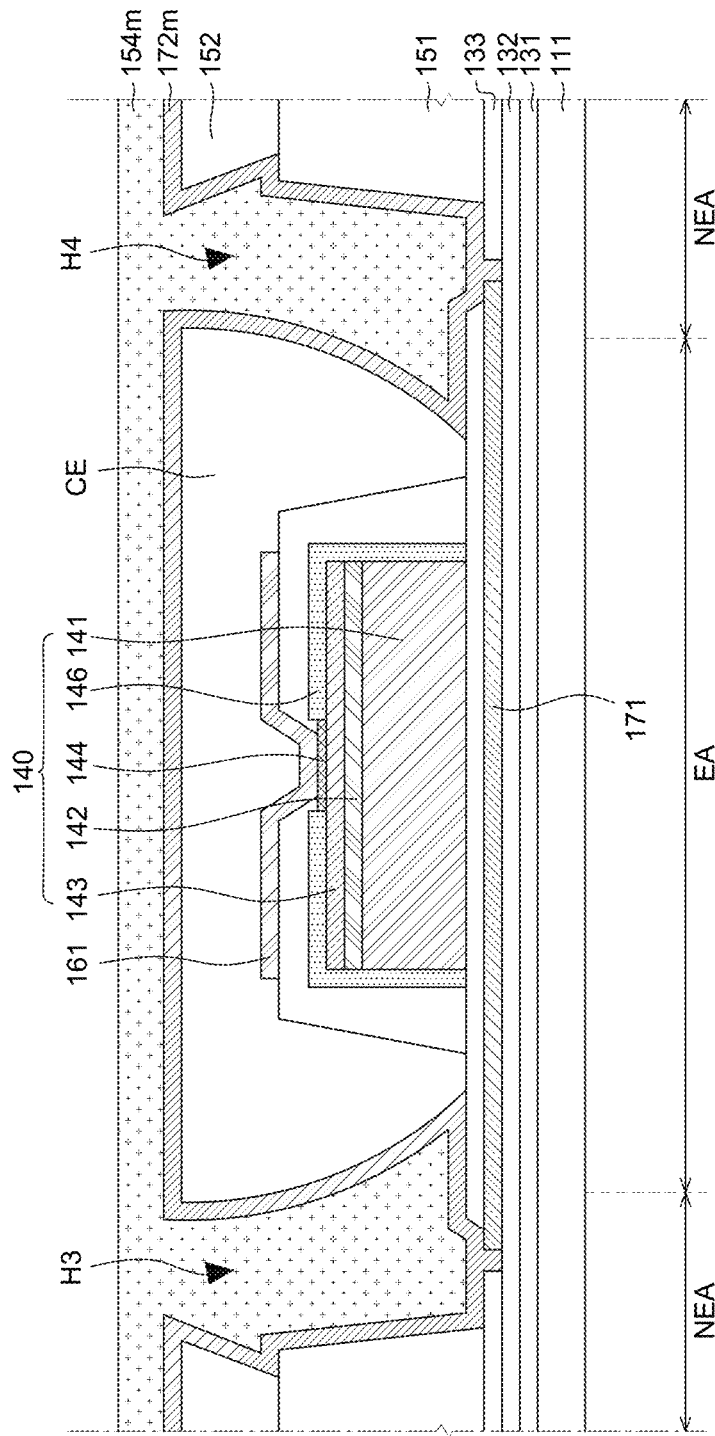
Figure 8D:
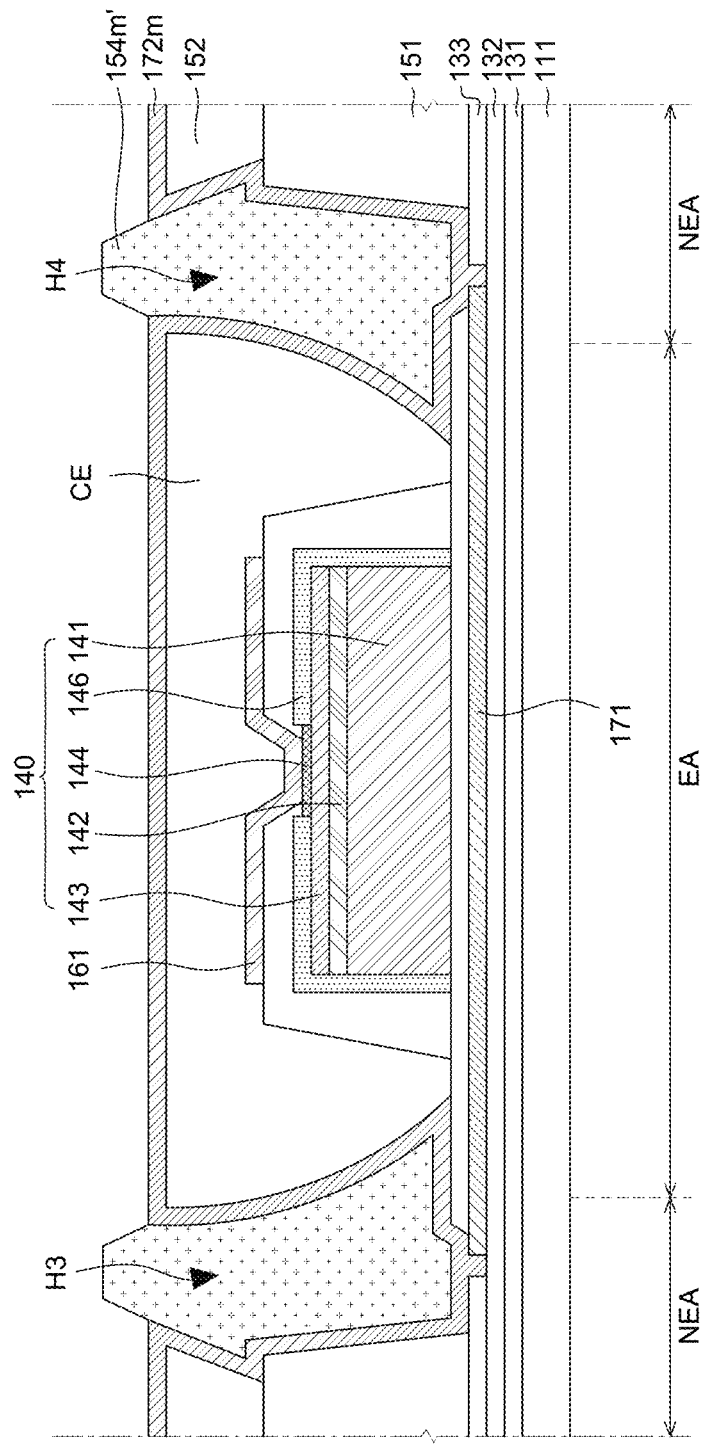
Figure 8E:
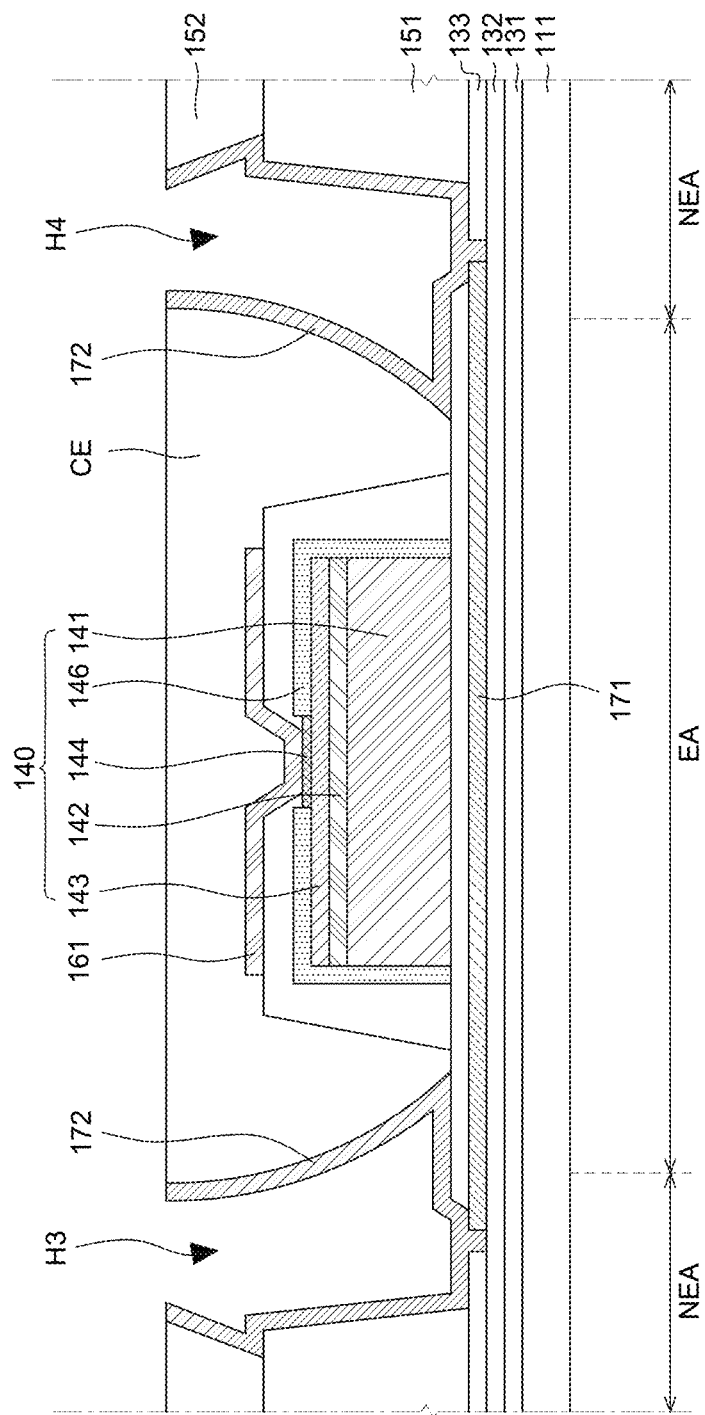

Next, referring to FIG. 8C, a photosensitive material layer 154m is formed on the substrate 111. The photosensitive material layer 154m may be a positive photoresist and may be an organic material. Next, referring to FIG. 8D, a part of the photosensitive material 154m is etched to remain the photosensitive material layer 154m' only in an area overlapping the third hole H3 and the fourth hole H4. Next, referring to FIG. 8E, the reflective material layer 172m on the upper surface of the second insulating layer 152 is etched. That is, the reflective material layer 172m on the upper surface of the second insulating layer 152 of the non-emission area NEA and the reflective material layer 172m on the upper surface of the light collecting structure CE of the emission area EA are etched. Accordingly, the second reflective layer 172 is formed on the side surface of the light collecting structure CE. Next, the photosensitive material layer 154m' included in the third hole H3 and the fourth hole H4 is removed.

The display device 100 may form a light collecting structure CE which is disposed to enclose the light emitting diode 140 according to the manufacturing method of the display device 100 according to the exemplary embodiment of the present disclosure illustrated in FIGS. 8A to 8E. The second reflective layer 172 may be formed on the side surface of the light collecting structure CE. The side surface of the light collecting structure CE may be formed to have a reverse tapered gradient so that the second reflective layer 162 guides the light emitted from the light emitting diode 140 to the upper portion of the light emitting diode 140 to improve the luminous efficiency of the display device 100. Further, the third hole H3 and the fourth hole H4 are filled with the photosensitive material layer 154m' so that only the reflective material layer 172m located on the upper surface of the light collecting structure CE may be etched. Accordingly, a height from the substrate 111 to the light collecting structure CE may be equal to a height from the substrate 111 to the second reflective layer 172. Therefore, most light emitted from the light emitting diode 140 may be reflected to the upper direction of the substrate 111 and the luminous efficiency of the display device 100 may be further improved.

The process diagrams illustrated in FIGS. 9A to 9E illustrate the manufacturing process of the display device 100 of FIGS. 3 to 6. The only difference between the process diagrams of FIGS. 9A to 9E and the process diagrams illustrated in FIGS. 8A to 8E is the process for forming the second reflective layer 172, but the others are substantially the same so that a redundant description will be omitted.

Figure 9A:
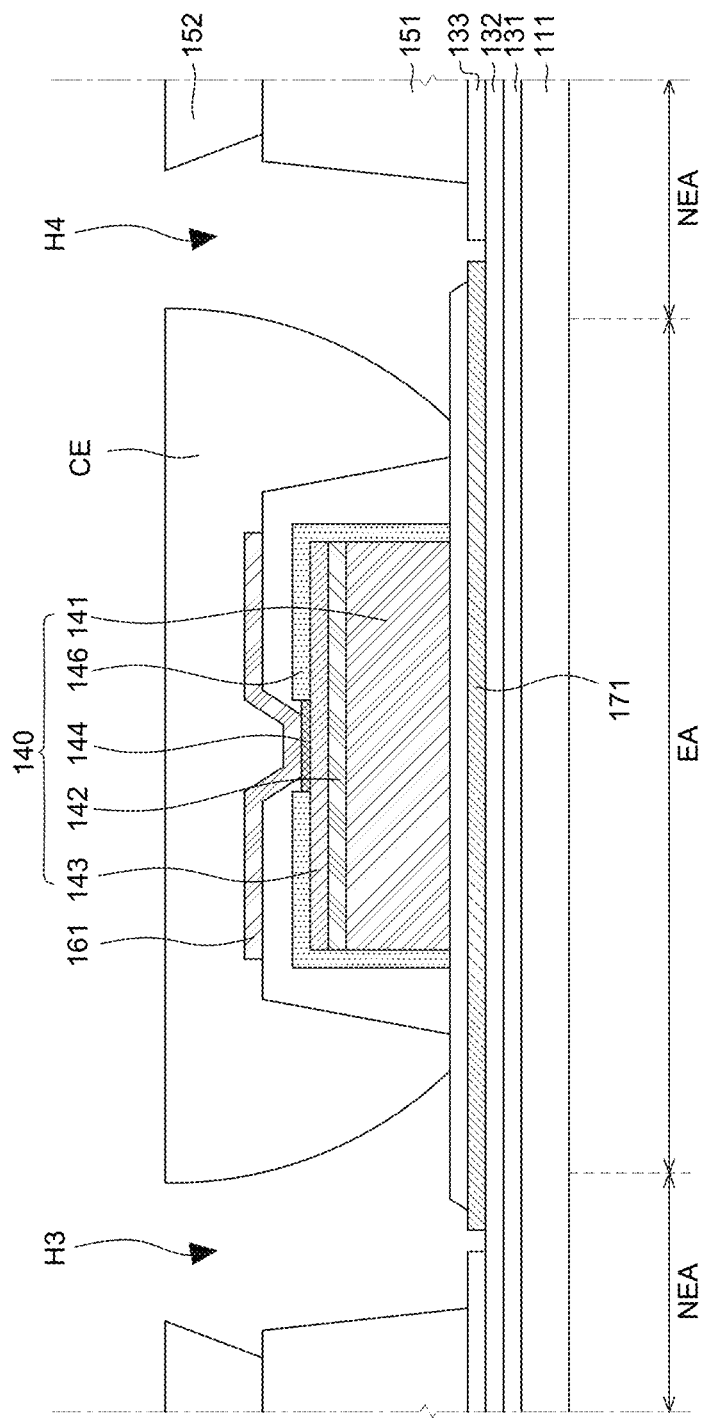
FIGS. 9A to 9E are schematic process diagrams for explaining a manufacturing method of a display device according to another exemplary embodiment of the present disclosure.
Figure 9B:
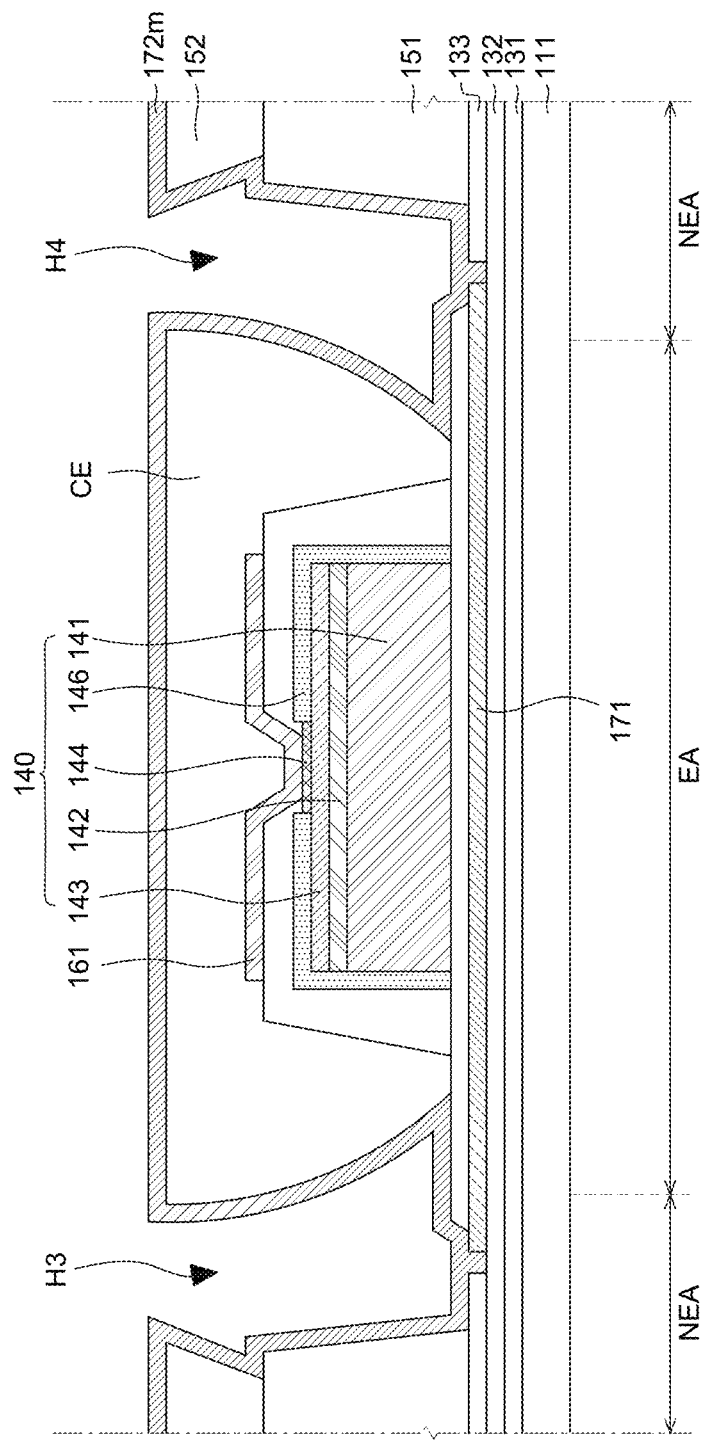
Figure 9C:
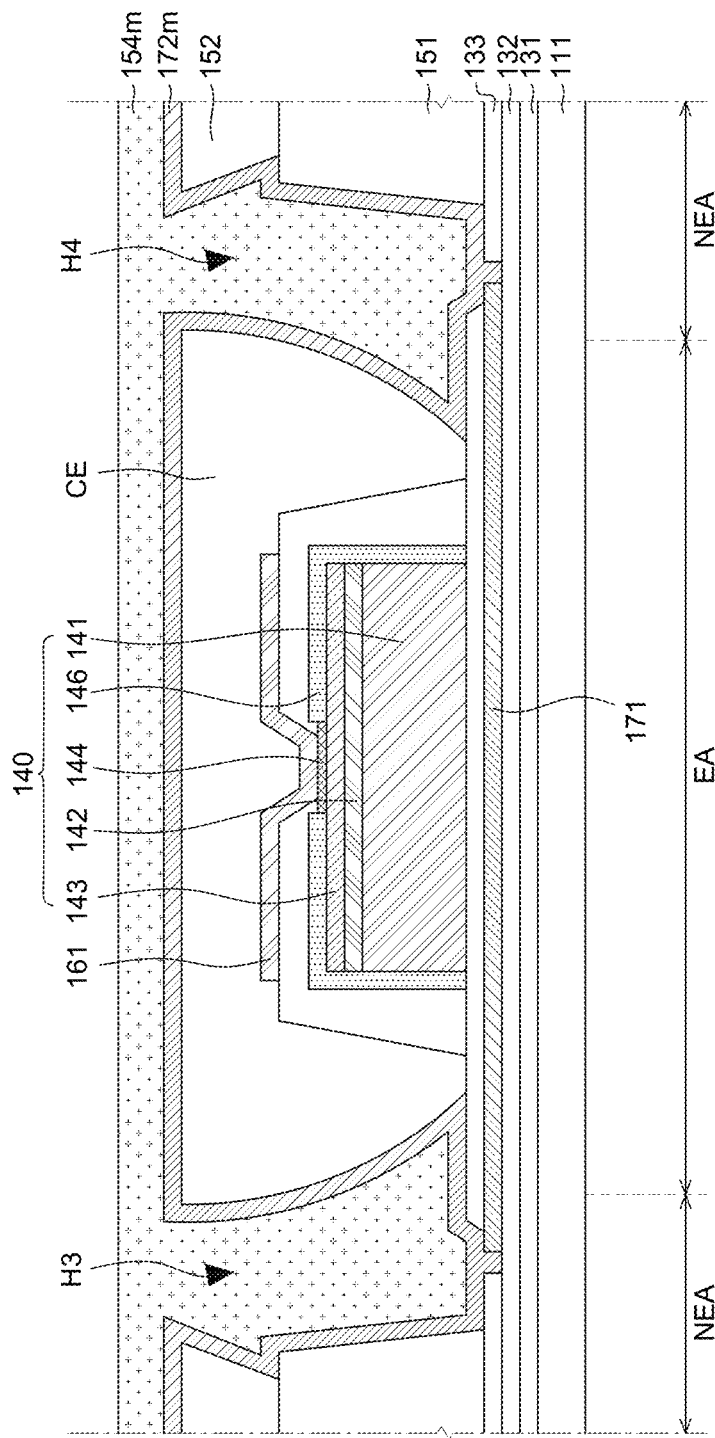
Figure 9D:
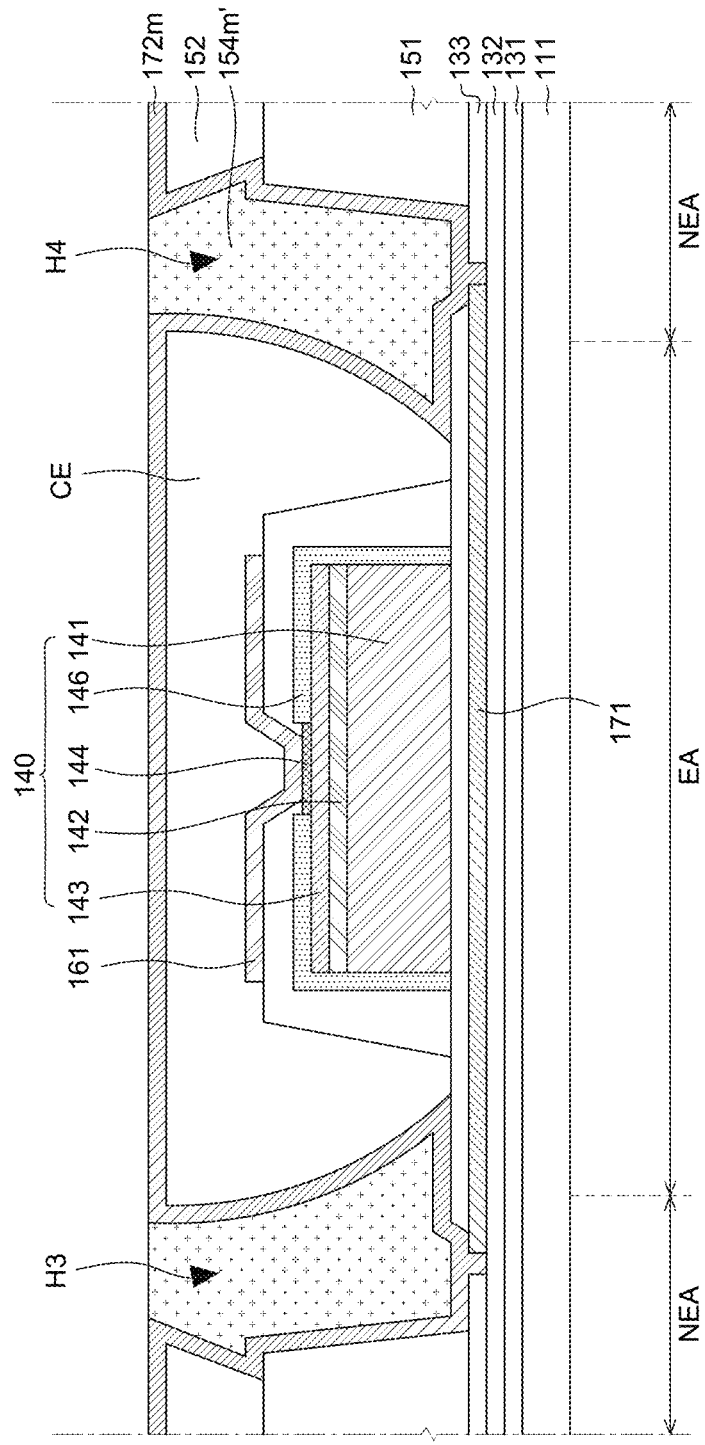
Figure 9E:
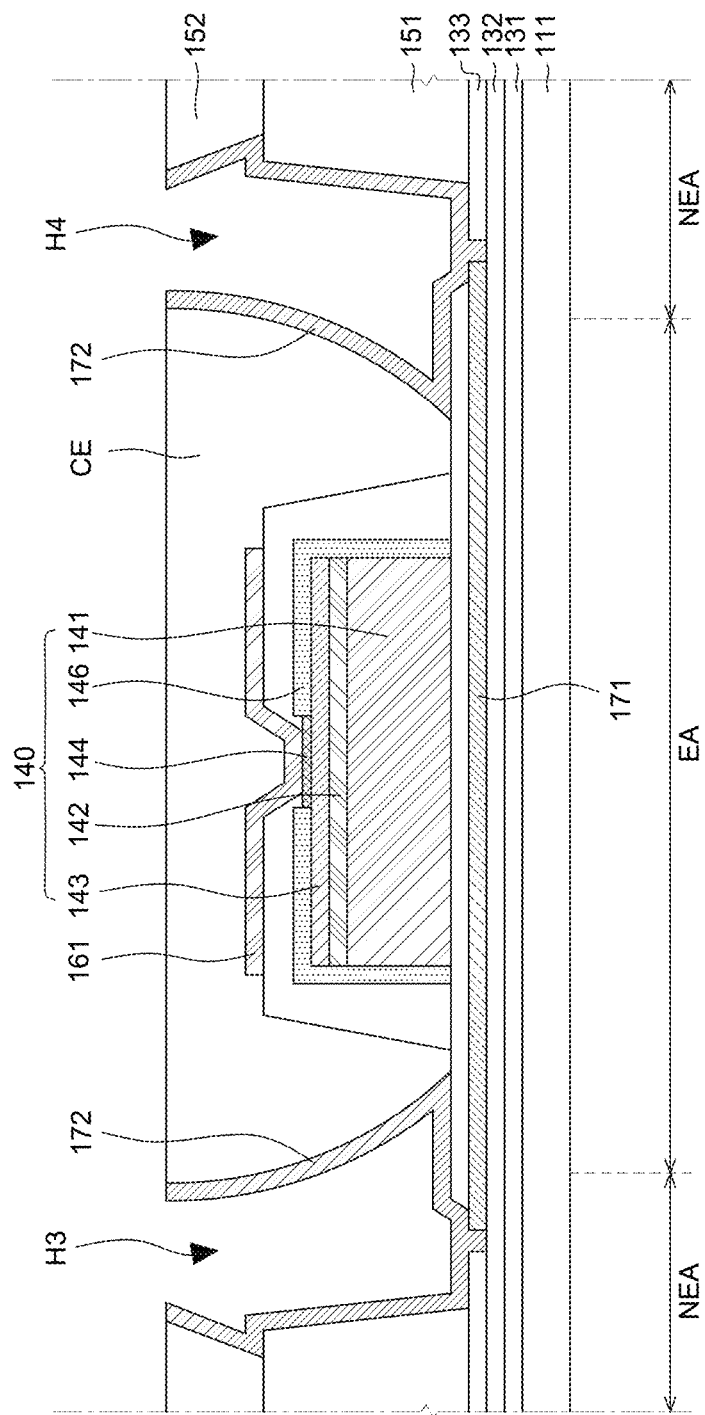

Referring to FIG. 9C, a photosensitive material layer 154m is formed on the substrate 111. Next, referring to FIG. 9D, the photosensitive material layer 154m and the reflective material layer 172m on the entire surface of the substrate 111 are etched. In this case, parts of the photosensitive material layer 154m and the reflective material layer 172m may be simultaneously etched by a dry etching process. Referring to FIG. 9E, the reflective material layer 172m above the second insulating layer 152 is etched to form the second reflective layer 172 on the side surface of the light collecting structure CE. Next, the photosensitive material layer 154m' remaining in the third hole H3 and the fourth hole H4 is removed.

The display device 100 may form the light collecting structure CE which is disposed to enclose the light emitting diode 140 and the second reflective layer 172 according to the manufacturing method of the display device 100 according to another exemplary embodiment of the present disclosure illustrated in FIGS. 9A to 9E. As compared with the processes illustrated in FIGS. 8A to 8E, the processes illustrated in FIGS. 9A to 9E do not require a process for removing a part of the photosensitive material layer 154m so that a process cost and a process time may be efficiently managed.

The exemplary embodiments of the present disclosure can also be described as follows:

A display device according to an aspect of the present disclosure may comprise a substrate including a pixel, a light emitting diode disposed in the pixel, an insulating layer covering the light emitting diode, a light collecting structure enclosing at least a part of the insulating layer and a reflective layer disposed on a side surface of the light collecting structure, wherein the side surface of the light collecting structure has a reverse tapered shape.

According to another feature of the present disclosure, the display device may further comprise a pixel circuit disposed on the substrate, wherein the pixel circuit is electrically connected to the light emitting diode through a first hole formed in the insulating layer.

According to yet another feature of the present disclosure, the display device may further comprise a first connecting electrode disposed on the insulating layer, wherein the first connecting electrode electrically connects the pixel circuit and the light emitting diode.

According to yet another feature of the present disclosure, a maximum height of the reflective layer may be higher than a height of a first electrode of the light emitting diode.

According to yet another feature of the present disclosure, a thickness of the insulating layer overlapping the first electrode may be larger than a linear distance from the first electrode to the reflective layer.

According to yet another feature of the present disclosure, the light emitting diode may include an n-type layer, an active layer, a p-type layer, a first electrode electrically connected to the n-type layer, and a second electrode electrically connected to the p-type layer and the first electrode and the second electrode may be disposed on the same surface of the light emitting diode.

According to yet another feature of the present disclosure, an angle formed by a normal line of the substrate and the reflective layer may be an acute angle.

According to yet another feature of the present disclosure, in a horizontal cross-sectional shape of the pixel, the reflective layer may be disposed to have a "C" shape to enclose the light emitting diode.

According to yet another feature of the present disclosure, in the horizontal cross-sectional shape of the pixel, the reflective layer may be bisymmetrically disposed.

A manufacturing method of a display device according to an aspect of the present disclosure may comprise disposing a light emitting diode on a substrate on which a pixel circuit is formed, forming a first insulating layer on the light emitting diode, forming a second insulating layer on the light emitting diode and the first insulating layer, forming a metal material layer on the second insulation layer and forming a reflective layer by etching at least a part of the metal material layer, wherein the reflective layer is formed on a side surface of the second insulating layer and the reflective layer forms an acute angle with a normal line of the substrate.

According to another feature of the present disclosure, the manufacturing method may further comprise forming a first hole and a second hole in the first insulating layer and forming a first connecting electrode and a second connecting electrode so as to overlap at least a part of the first hole and the second hole, the forming of a first hole and a second hole and the forming of a first connecting electrode and a second connecting electrode are performed after the forming of a first insulating layer and before the forming of a second insulating layer.

According to yet another feature of the present disclosure, the light emitting diode may include a first electrode and a second electrode, the first electrode is electrically connected to the first connecting electrode, and the second electrode is electrically connected to the second connecting electrode.

According to yet another feature of the present disclosure, the light emitting diode may include an n-type layer, an active layer, and a p-type layer, the first electrode is electrically connected to the p-type layer, and the first connecting electrode is electrically connected to the p-type layer and the pixel circuit.

According to yet another feature of the present disclosure, the manufacturing method may further comprise forming a photosensitive material layer on the substrate and the second insulating layer, wherein the forming of a photosensitive material layer is performed between the forming of a metal material layer and the forming of a reflective layer.

According to yet another feature of the present disclosure, the forming of a reflective layer may include etching the metal material layer exposed by the photosensitive material layer.

According to yet another feature of the present disclosure, a thickness of the second insulating layer formed on the first electrode may be larger than a distance from the first electrode to the reflective layer.

According to yet another feature of the present disclosure, the manufacturing method may further comprise forming a third hole and a fourth hole in the second insulating layer, wherein the forming of a third hole and a fourth hole is performed before the forming of a metal material layer.

According to yet another feature of the present disclosure, in a horizontal cross-sectional shape including the light emitting diode, the third hole and the fourth hole enclose the light emitting diode and the third hole may be physically separated from the fourth hole.

According to yet another feature of the present disclosure, the manufacturing method may further comprise forming a third insulating layer on the second insulating layer, wherein the third insulating layer includes a black material.

According to yet another feature of the present disclosure, the third insulating layer may be formed in the third hole and the fourth hole.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:
a substrate including a pixel defined thereon;
at least one light emitting diode disposed in the pixel;
an insulating layer covering the light emitting diode;
a pixel circuit disposed on the substrate;
a light collecting structure on at least a part of the insulating layer; and
a reflective layer disposed at a side surface of the light collecting structure,
wherein the side surface of the light collecting structure has a reverse tapered shape, and
wherein the pixel circuit is electrically connected to the light emitting diode through a first hole formed in the insulating layer.

2. The display device of claim 1, further comprising:
a first connecting electrode disposed on the insulating layer,
wherein the first connecting electrode electrically connects the pixel circuit and the light emitting diode.

3. The display device of claim 1, wherein a top of the reflective layer is higher than a top of a first electrode of the light emitting diode.

4. The display device of claim 3, wherein a thickness of the insulating layer overlapping the first electrode is larger than a vertical distance from the top of the first electrode to the top of the reflective layer.

5. The display device of claim 1, wherein the light emitting diode includes an n-type layer, an active layer, a p-type layer, a first electrode electrically connected to the n-type layer, and a second electrode electrically connected to the n-type layer and the first electrode and the second electrode are disposed on the same surface of the light emitting diode.

6. The display device of claim 1, wherein an angle formed by a normal line of the substrate and a surface of the reflective layer at a bottom of the reflective layer is an acute angle.

7. The display device of claim 6, wherein in a horizontal cross-sectional shape of the pixel, the reflective layer is disposed to have a "C" shape to enclose the light emitting diode.

8. The display device of claim 7, wherein in a horizontal cross-sectional shape of the pixel, the reflective layer is bisymmetrically disposed.

9. The display device of claim 1, wherein the pixel includes a first light emitting diode and a second light emitting diode, the first light emitting diode emitting the same color light as the second light emitting diode, and
wherein the first light emitting diode and the second light emitting diode are disposed in a line in the pixel and are adjacent to each other.

10. The display device of claim 9, wherein the first light emitting diode is disposed in a first row of the pixel and is configured by elements which emit different color light, and the second light emitting diode is disposed in a second row of the pixel and is configured by elements which emit different color light.

11. A manufacturing method of a display device, comprising:
disposing a light emitting diode on a substrate on which a pixel circuit is formed;
forming a first insulating layer on the light emitting diode;
forming a second insulating layer on the light emitting diode and the first insulating layer;
forming a metal material layer on the second insulation layer; and
forming a reflective layer by etching at least a part of the metal material layer,
wherein the reflective layer is formed at a side surface of the second insulating layer and a bottom of the reflective layer forms an acute angle with a normal line of the substrate.

12. The manufacturing method of claim 11, further comprising:
forming a first hole and a second hole in the first insulating layer; and
forming a first connecting electrode and a second connecting electrode that overlaps at least a part of the first hole and the second hole,
wherein the forming of the first hole and the second hole and the forming of the first connecting electrode and the second connecting electrode are performed after the forming of the first insulating layer and before the forming of the second insulating layer.

13. The manufacturing method of claim 12, wherein the light emitting diode includes a first electrode and a second electrode, the first electrode is electrically connected to the first connecting electrode, and the second electrode is electrically connected to the second connecting electrode.

14. The manufacturing method of claim 13, wherein the light emitting diode includes an n-type layer, an active layer, and a p-type layer, the first electrode is electrically connected to the p-type layer, and the first connecting electrode is electrically connected to the p-type layer and the pixel circuit.

15. The manufacturing method of claim 11, further comprising:
forming a photosensitive material layer on the substrate and the second insulating layer,
wherein the forming of the photosensitive material layer is performed between the forming of the metal material layer and the forming of the reflective layer.

16. The manufacturing method of claim 15, wherein the forming of the reflective layer includes etching the metal material layer exposed by the photosensitive material layer.

17. The manufacturing method of claim 11, wherein a thickness of the second insulating layer formed on a first electrode is larger than a vertical distance from a top of the first electrode to a top of the reflective layer.

18. The manufacturing method of claim 11, further comprising:
forming a third hole and a fourth hole in the second insulating layer;
wherein the forming of the third hole and the fourth hole is performed before the forming of the metal material layer.

19. The manufacturing method of claim 18, wherein, in a horizontal cross-section that includes the light emitting diode, the third hole and the fourth hole enclose the light emitting diode and the third hole is physically separated from the fourth hole.

20. The manufacturing method of claim 18, further comprising:
forming a third insulating layer on the second insulating layer,
wherein the third insulating layer includes a black material.

21. The manufacturing method of claim 18, wherein a third insulating layer is formed in the third hole and the fourth hole.

22. The manufacturing method of claim 11, wherein the substrate includes a pixel defined thereon,
wherein the light emitting diode includes a first light emitting diode and a second light emitting diode, the first light emitting diode emitting the same color light as the second light emitting diode, and
wherein the first light emitting diode and the second light emitting diode are disposed in a line in the pixel and are adjacent to each other.

23. The manufacturing method of claim 22, wherein the first light emitting diode is disposed in a first row of the pixel and is configured by elements which emit different color light, and the second light emitting diode is disposed in a second row of the pixel and is configured by elements which emit different color light.

* * * * *